United States Patent
Casagrande et al.

(10) Patent No.: US 7,719,326 B2
(45) Date of Patent: May 18, 2010

(54) DUAL-MODULUS PRESCALER CIRCUIT OPERATING AT A VERY HIGH FREQUENCY

(75) Inventors: Arnaud Casagrande, Hauterive (CH);
Carlos Velasquez, Neuchâtel (CH);
Jean-Luc Arend, Neuchâtel (CH)

(73) Assignee: The Swatch Group Research and Development Ltd., Marin (CH)

( * ) Notice: Subject to any disclaimer, the term of this patent is extended or adjusted under 35 U.S.C. 154(b) by 0 days.

(21) Appl. No.: 12/332,848

(22) Filed: Dec. 11, 2008

(65) Prior Publication Data

US 2009/0146699 A1 Jun. 11, 2009

(30) Foreign Application Priority Data

Dec. 11, 2007 (EP) .................................. 07122935

(51) Int. Cl.
*H03K 21/00* (2006.01)
*H03K 23/00* (2006.01)
(52) U.S. Cl. ................... 327/115; 327/117; 327/118; 377/47
(58) Field of Classification Search ......... 327/113–115, 327/117, 118; 377/47, 48
See application file for complete search history.

(56) References Cited

U.S. PATENT DOCUMENTS

| | | | |
|---|---|---|---|
| 5,020,082 A | | 5/1991 | Takeda |
| 5,592,114 A | * | 1/1997 | Wu et al. ..................... 327/208 |
| 6,157,693 A | * | 12/2000 | Jayaraman .................... 377/47 |
| 6,385,276 B1 | | 5/2002 | Hunt, Jr. et al. |
| 6,501,816 B1 | * | 12/2002 | Kouznetsov et al. .......... 377/48 |
| 6,614,274 B1 | | 9/2003 | Shi et al. |
| 6,696,857 B1 | | 2/2004 | Rana |
| 7,298,810 B2 | * | 11/2007 | Ke ............................... 377/48 |
| 7,587,019 B2 | * | 9/2009 | Yu et al. ....................... 377/47 |
| 2006/0017473 A1 | | 1/2006 | Hu |

OTHER PUBLICATIONS

Pellerano, S.; Levantino, S.; Samori, C.; Lacaita, A.L., "A 13.5-mW 5-GHz frequency synthesizer with dynamic-logic frequency divider," Solid-State Circuits, IEEE Journal of, vol. 39, No. 2, pp. 378-383, Feb. 2004.*

(Continued)

*Primary Examiner*—Lincoln Donovan
*Assistant Examiner*—Patrick O'Neill
(74) *Attorney, Agent, or Firm*—Griffin & Szipl, P.C.

(57) ABSTRACT

The dual-modulus prescaler circuit (1) is devised to operate at a very high frequency. This circuit includes an assembly formed of two dynamic D-type flip flops (12, 13), and two NAND logic gates (15, 16) arranged in negative feedback between the two flip flops. The two flip flops are clocked by an input clock signal (CK) to supply a divided output signal (OUT) whose frequency matches the input clock frequency divided by 2 or by 3 as a function of a division mode selection signal (divb) applied to the input of the first NAND logic gate (15). One non-inverted output of the second flip flop is connected to one input of the first flip flop (12). The first dynamic flip flop includes three active branches and supplies a single inverted output signal. A third flip flop (14) with three active branches receives an inverted mode selection signal (div) at input in order to supply the mode selection signal to the inverted output thereof, clocked by the non-inverted output signal of the second flip flop.

9 Claims, 2 Drawing Sheets

OTHER PUBLICATIONS

Xiao Peng Yu; Manh Anh Do; Wei Meng Lim; Kiat Seng Yeo; Jian-Guo Ma, "Design and Optimization of the Extended True Single-Phase Clock-Based Prescaler," Microwave Theory and Techniques, IEEE Transactions on , vol. 54, No. 11, pp. 3828-3835, Nov. 2006.*

Search Report issued by Australian Patent Office in corresponding Singapore patent application SG 200807995-6 completed Feb. 12, 2009 and mailed Mar. 5, 2009.

Rategh, Hamid R., "A CMOS Frequency Synthesizer with an Injection-Locked Frequency Divider for a 5-GHz Wireless LAN Receiver," IEEE Journal on Solid-State Circuits, vol. 35, No. 5, May 2000, pp. 780-787.

European Search Report issued in corresponding application No. EP 07 12 2935, completed Apr. 18, 2008.

* cited by examiner

DUAL-MODULUS PRESCALER CIRCUIT OPERATING AT A VERY HIGH FREQUENCY

This application claims priority from European Patent Application No. 07122935.5 filed Dec. 11, 2007, the entire disclosure of which is incorporated herein by reference.

FIELD OF THE INVENTION

The invention concerns a dual-modulus prescaler circuit operating at a very high frequency in particular arranged in a phase lock loop of a frequency synthesiser. The counter-divider or prescaler circuit includes at least an assembly comprising two dynamic D-type flip flops, and two logic gates arranged in negative feedback between the two flip flops. These two flip flops are clocked by an input clock signal to supply an output signal whose frequency matches the input clock signal divided by a first factor equal to 2, or by a second factor equal to 3 in accordance with the selected division mode.

It should be noted that "very high frequency signals" are signals with a higher frequency than 1 GHz. This very high frequency is, for example, the carrier frequency of a transmission channel on which data to be transmitted is modulated in signals generated at the output of a voltage-controlled oscillator of a frequency synthesiser. These signals are thus used in wireless communication systems, such as in a cellular communication network.

BACKGROUND OF THE INVENTION

A frequency synthesiser conventionally includes a phase lock loop, in which a dual-modulus prescaler circuit divides the synthesiser output signal frequency by a first factor or a second factor as a function of a selected division mode. Mode selection is performed, for example, by a modulator, such as a sigma delta modulator such that the synthesiser output generates signals at the desired frequency within a determined frequency band.

FIG. 1 shows a conventional dual-modulus prescaler circuit 1. This circuit is capable of dividing the frequency of an input signal CK by a first factor equal to 2 or by a second factor equal to 3 in accordance with the selected mode div.

In order to do this, the prescaler or counter-divider circuit may include two or three standard D-type flip flops 2, 3, 4 and two NOR logic gates 5, 6 in negative feedback arranged between a first flip flop 2 and a second flip flop 3. Each of these flip flops is capable of providing a non-inverted output signal Q and an inverted output signal Qb in accordance with an input signal D. The first and second flip flops 2 and 3 are clocked by the input clock signal CK. A third flip flop 4 clocked by an output signal OUT from second flip flop 3, may also be provided. This third flip flop 4 is only used to ensure proper resynchronisation during a mode change div. The frequency of this output signal OUT of prescaler circuit 1 matches the frequency of input signal CK divided by the first division factor or the second division factor in accordance with the selected mode div.

The first NOR logic gate 5 receives at input the non-inverted output signal Q from the first flip flop 2, and the non-inverted output signal Q from the third flip flop 4 representing the selection of division mode div. The output of this first logic gate 5 is connected to one input of the second NOR logic gate 6, the input of which also receives the non-inverted output signal Q from second flip flop 3. The output of this second logic gate 6 is connected to input D of the second flip flop 3. The output signal OUT from prescaler circuit 1 is supplied to the inverted output Qb of second flip flop 3. This output signal OUT is also the input signal D of first flip flop 2.

If the selected mode div is in state 1, i.e. a high voltage state, prescaler circuit 1 divides the frequency of input signal CK by a first factor equal to 2. Conversely, if the selected mode div is in state 0, i.e. a low voltage state, prescaler circuit 1 divides the frequency of input signal CK by a second factor equal to 3.

Each NOR logic gate 5, 6 is made with two PMOS transistors in series, which are connected in series with two parallel NMOS transistors between a positive supply terminal and a negative supply terminal of a voltage source. One gate of the first PMOS transistor is connected to one gate of the first NMOS transistor to form a first gate input. One gate of the second PMOS transistor is connected to one gate of the second NMOS transistor to form a second gate input. The connection node between the PMOS transistors and NMOS transistors forms the logic gate output.

Due to the use of NOR logic gates with two PMOS transistors in series that are slow, this type of prescaler circuit is not provided to operate normally at a very high frequency, which constitutes a drawback. Moreover, since three standard D-type flip flops are used, this prescaler circuit consumes a significant amount of electrical power.

SUMMARY OF THE INVENTION

It is thus an object of the invention to provide a dual-modulus prescaler circuit, which overcomes the aforementioned drawbacks of the state of the art, with a relatively simple structure, made in CMOS technology and which operates at a very high frequency.

The invention therefore concerns the aforecited dual-modulus prescaler circuit, which includes the features defined in the independent claim 1.

Particular embodiments of the prescaler circuit are defined in dependent claims 2 to 8.

One advantage of the prescaler circuit according to the invention is that it includes two NAND logic gates, which are made with two NMOS transistors in series, which are connected in series to two parallel PMOS transistors between two terminals of a continuous voltage source. Since each NMOS transistor switches rapidly compared to each PMOS transistor, each NAND logic gate forms a prescaler circuit capable of operating at a very high frequency.

One of the two flip flops advantageously provides only one output signal through an inverted output, which means that this flip flop can be made with one active branch less than a standard D-type flip flop in order to reduce the electrical power consumption of said circuit. The D-type flip flops are advantageously dynamic flip flops for the dual-modulus prescaler circuit, capable of operating at a very high frequency.

BRIEF DESCRIPTION OF THE DRAWINGS

The objects, advantages and features of the dual-modulus prescaler circuit will appear more clearly in the following description, made on the basis of at least one non-limiting example and illustrated by the drawings, in which.

DETAILED DESCRIPTION OF THE PREFERRED EMBODIMENTS

In the following description, the dual-modulus prescaler or counter-divider circuit is devised to be able to operate normally at a very high frequency, particularly in the phase lock loop of a frequency synthesiser. Of course, it may also include, in addition to the divider-by-2 or divider-by-3 assembly, a chain of dividers preferably connected to the output of the assembly. The circuit can thus divide the frequency of a very high frequency signal by a first factor N, where N is at least an integer number higher than or equal to 2, or by a second factor N+M, where M is at least an integer number higher than or equal to 1.

Figure 1:
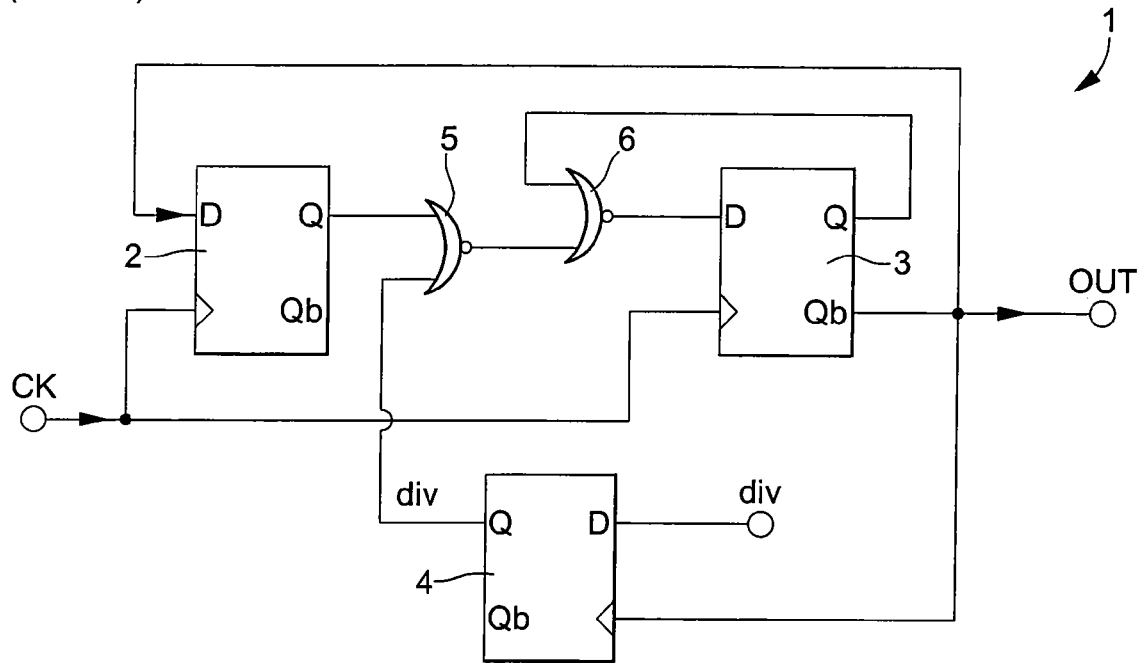
FIG. 1, already cited, shows a simplified embodiment of a dual-modulus prescaler circuit of the state of the art.
Figure 2:
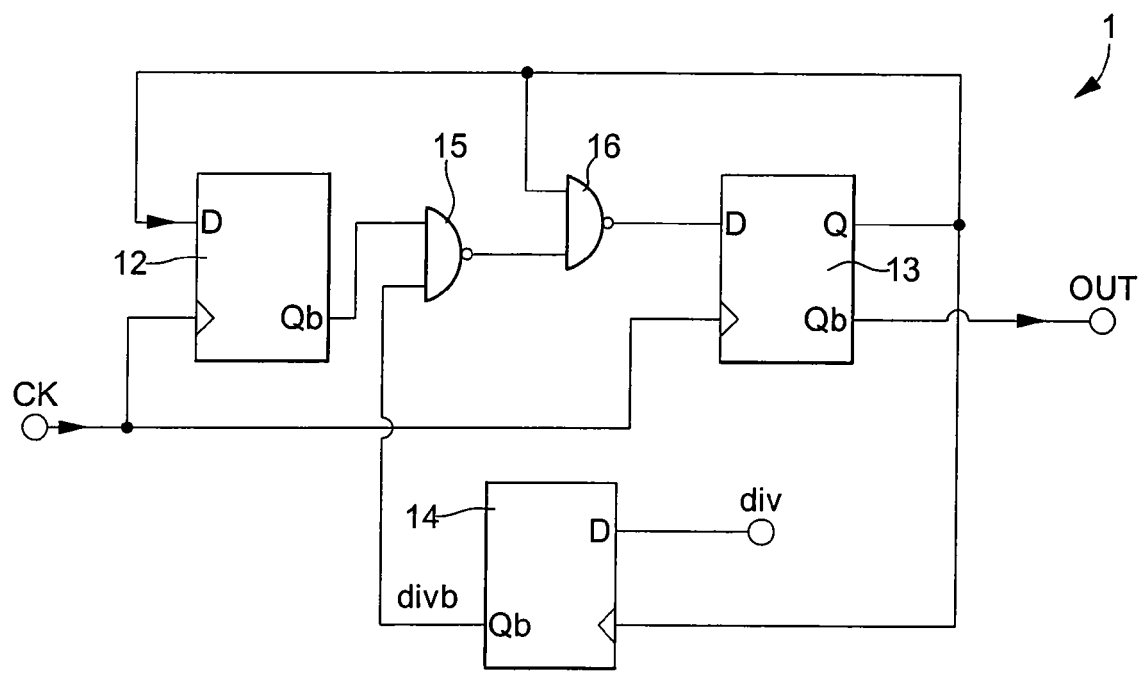
FIG. 2 shows a simplified embodiment of a dual-modulus prescaler circuit according to the invention.

FIG. 2 shows a simplified structure of a dual-modulus prescaler circuit 1 according to the invention, capable of operating at a very high frequency, for example for dividing a frequency of the order of 2.45 GHz. This prescaler or counter-divider circuit includes at least one assembly, which is made up of two dynamic D-type flip flops 12 and 13, and two NAND logic gates 15 and 16. These logic gates are arranged in negative feedback between the two flip flops 12, 13. This assembly forms the input stage of the prescaler circuit, which may include several dividers-by-2, for example, after the assembly.

Flip flops 12 and 13 are clocked by an input clock signal CK so that the prescaler circuit assembly supplies an output signal OUT. This output signal is preferably supplied to the inverted output Qb of second flip flop 13. The frequency of this output signal OUT matches the frequency of the input clock signal divided by a first factor equal to 2, or by a second factor equal to 3, in accordance with the selected division mode div.

The assembly of prescaler circuit 1 may also include a third dynamic flip flop 14 as shown in FIG. 2. This third dynamic flip flop ensures proper resynchronisation when division mode div is changed, which may occur rapidly at a high frequency. This third flip flop is clocked by an output signal of second flip flop 13. In this embodiment, the non-inverted output signal Q of second flip flop 13 clocks third flip flop 14. Of course, mode selection by signal divb could also be carried out without using this third lower frequency flip flop.

The first NAND logic gate 15 receives at input the inverted output signal Qb from first flip flop 12, and the inverted output signal Qb from the third flip flop 14 representing the inverted division mode selection divb. The output of this first logic gate 15 is connected to an input of the second NAND logic gate 16, which also receives at input the non-inverted output signal Q from the second flip flop 13. The output of this second logic gate 16 is connected to the input D of the second flip flop 13. The non-inverted output signal Q from second flip flop 13 also forms the input signal D of the first flip flop 12. The output signal OUT from prescaler circuit 1 can be provided to the inverted output Qb of second flip flop 13.

As explained below with reference to FIGS. 3 and 4, it is preferable to provide output signal OUT through inverted output Qb of second dynamic flip flop 13. In this case, fewer active branches are used between input CK of prescaler circuit 1 and output OUT to carry out a very high frequency division. The first single-phase dynamic flip flop 12 also only supplies inverted output signal Qb, which economises one active branch compared to a standard D-type flip flop, and consequently reduces the electrical power consumption of prescaler circuit 1. The same is true of third flip flop 14.

If the selected mode div is at state 1, i.e. the high state, prescaler circuit 1 divides the frequency of input signal CK by a first factor equal to 2. However, if the selected mode div is at state 0, i.e. the low state, prescaler circuit 1 divides the frequency of input signal CK by a second factor equal to 3.

The NAND logic gates can each be made with two series NMOS transistors, which are connected in series to two parallel PMOS transistors, connected between two terminals of a continuous voltage source (not shown). One gate of the first NMOS transistor is connected to one gate of the first PMOS transistor to form a first input of the logic gate. One gate of the second NMOS transistor is connected to one gate of the second PMOS transistor to form a second input of the logic gate. The drain connection node between the NMOS and PMOS transistors forms the logic gate output. Since the switching of each NMOS transistor is very rapid, compared to the switching of each PMOS transistor, each NAND logic gate can form a prescaler circuit able to operate at a very high frequency.

The prescaler or counter-divider circuit may advantageously be integrated in a P-doped silicon substrate in 0.18 μm CMOS technology.

Figure 3:
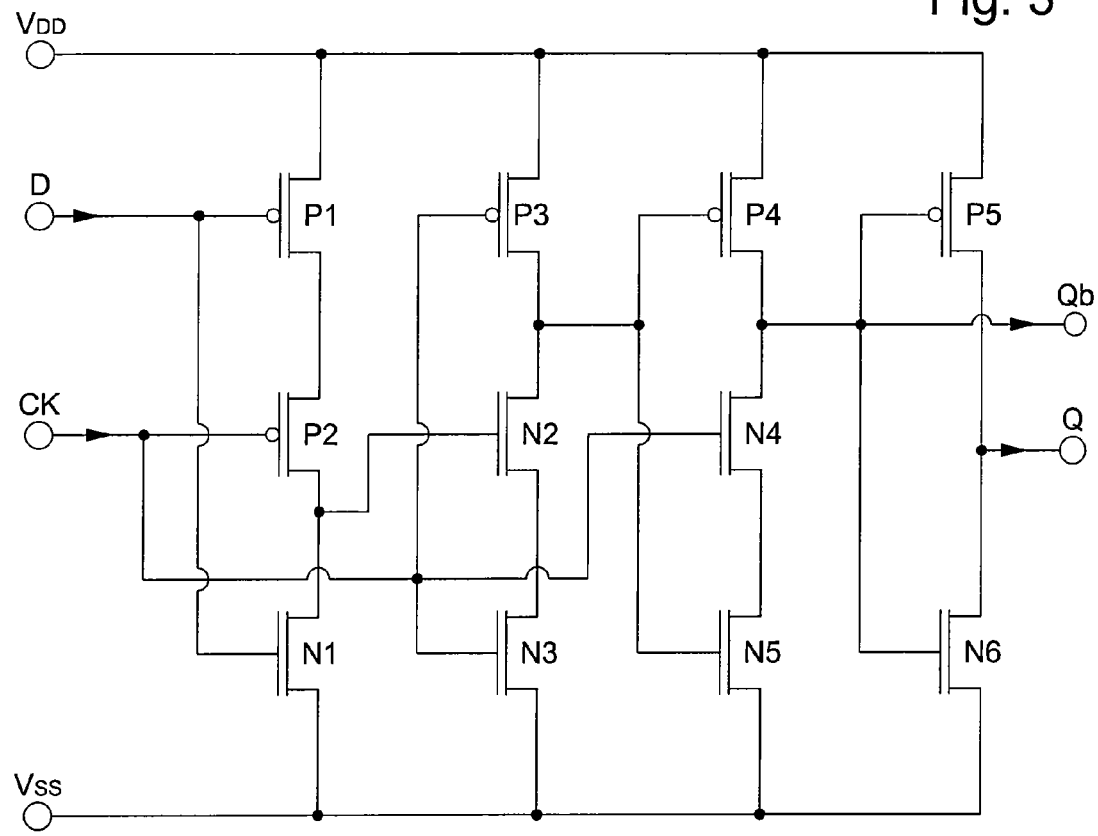
FIG. 3 shows an embodiment of a dynamic D-type flip flop including one inverted output and one non-inverted output for a prescaler circuit according to the invention.
Figure 4:
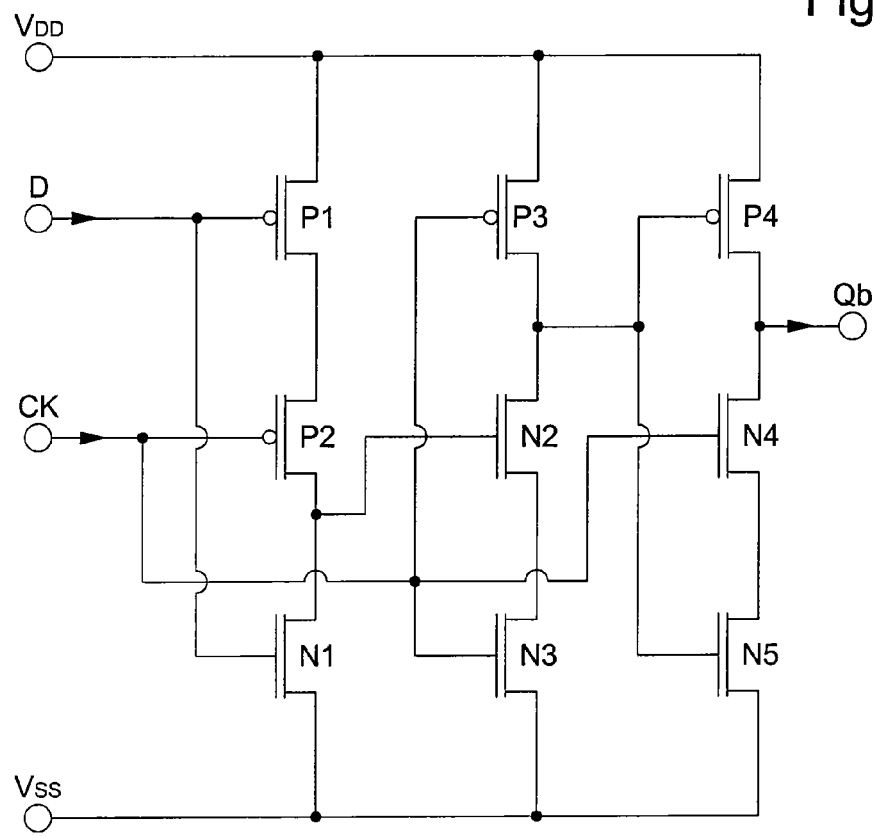
FIG. 4 shows an embodiment of a single phase dynamic D-type flip flop including a single inverted output for a prescaler according to the invention.

FIGS. 3 and 4 show one embodiment of a dynamic D-type flip flop with two outputs Q and Qb seen in FIG. 3, and one embodiment of a dynamic D-type flip flop with a single inverted output Qb seen in FIG. 4. This true single-phase dynamic flip flop is advantageously used for the dual-modulus prescaler circuit for very high frequency operation (higher than 1 GHz) and a reduction in electrical power consumption.

First of all in FIG. 3, the dynamic D-type flip flop with two outputs Q and Qb is that used as second flip flop 13 shown in FIG. 2. This dynamic flip flop includes three active branches each formed of three series MOS transistors and one last active branch formed of two series MOS transistors. These MOS transistors are arranged between two terminals $V_{DD}$ and $V_{SS}$ of a continuous voltage source powering the dual-modulus prescaler circuit.

A first active branch thus includes, in series, a first PMOS transistor P1, a second PMOS transistor P2, and a first NMOS transistor N1. The source of the first PMOS transistor P1 is connected to the positive terminal $V_{DD}$ and its drain is connected to the source of the second PMOS transistor P2. The drain of this second PMOS transistor P2 is connected to the drain of the first NMOS transistor N1, whose source is connected to the negative terminal $V_{SS}$. The gates of the first PMOS and NMOS transistors P1 and N1 are connected to define the input terminal D of the flip flop. The gate of the second PMOS transistor P2 receives the input clock signal CK, whose frequency has to be divided in the prescaler circuit.

A second active branch thus includes, in series, a third PMOS transistor P3, a second NMOS transistor N2 and a third NMOS transistor N3. The source of the third PMOS transistor P3 is connected to the positive terminal $V_{DD}$ and its drain is connected to the drain of the second NMOS transistor N2. The source of this second NMOS transistor N2 is connected to the drain of the third NMOS transistor N3, whose source is connected to negative terminal $V_{SS}$. The gates of the third PMOS and NMOS transistors P3 and N3 are connected for receiving the input clock signal CK. The gate of the second NMOS transistor N2 is, however, connected to the drain of the first NMOS transistor N1 and the second PMOS transistor P2.

A third active branch thus includes, in series, a fourth PMOS transistor P4, a fourth NMOS N4 and a fifth NMOS transistor N5. The source of fourth PMOS transistor P4 is connected to the positive terminal $V_{DD}$ and its drain is connected to the drain of the fourth NMOS transistor N4. The source of this fourth NMOS transistor N4 is connected to the drain of the fifth NMOS transistor N5, whose source is connected to the negative terminal $V_{SS}$. The gates of the fourth PMOS transistor P4 and of the fifth NMOS transistor N5 are connected to the drain of the second NMOS transistor N2 and of the third PMOS transistor P3. The gate of the fourth NMOS transistor N4 receives the clock input signal CK. One inverted output Qb of the flip flop can be obtained at the connection node of the drains of the fourth PMOS transistor P4 and NMOS transistor N4.

Finally, a fourth active branch shows an inverter stage. This fourth branch thus includes, in series, between the two supply terminals $V_{DD}$ and $V_{SS}$, a fifth PMOS transistor P5 and a sixth NMOS transistor N6. The source of the fifth PMOS transistor P5 is connected to the positive terminal $V_{DD}$ and its drain is connected to the drain of the sixth NMOS transistor N6, thus defining the non-inverted output node Q. The source of the sixth NMOS transistor N6 is connected to the negative terminal $V_{SS}$.

Of course, if one wishes to make a simplified dynamic flip flop with a single inverted output Qb shown in FIG. 4, this last active branch, as the inverter stage, is omitted. This reduces the electrical power consumption of the flip flop. Consequently, as the prescaler or counter-divider circuit is made up of this simplified type of flip flop 12 or two simplified flip flops 12 and 14 as shown in FIG. 2, it is possible to reduce the circuit's electrical power consumption while allowing it to operate at a very high frequency.

From the description that has just been given, several variants of the dual-modulus prescaler circuit may be devised by those skilled in the art, without departing from the scope of the invention defined by the claims. The dual-modulus prescaler circuit may include a series of several dividers-by-2 or by-3. The prescaler circuit assembly may also be combined with a chain of dividers, particularly dividers-by-2, enabling one factor to be selected from two suitable division factors in a frequency synthesiser phase lock loop. Preferably, the divider-by-2 or by-3 assembly is at the input of the prescaler circuit.

What is claimed is:

1. A dual-modulus prescaler circuit for operating at a very high frequency, said circuit including at least one assembly formed of first and second dynamic D-type flip flops, and two logic gates arranged in negative feedback between the two flip flops, which are clocked by an input clock signal in order to supply a divided output signal through the second flip flop, whose frequency matches the input clock signal frequency divided by a first factor equal to 2, or by a second factor equal to 3 as a function of a division mode selection signal applied to the input of one of the logic gates, one output of the second flip flop being connected to one input of the first flip flop, wherein the two logic gates are NAND gates, and wherein one of the dynamic flip flops is formed of three active branches so as to provide only one inverted output signal.

2. The prescaler circuit according to claim 1, wherein the first NAND gate is arranged for receiving the inverted output signal from the first dynamic flip flop, which has only three active branches, and the division mode selection signal, wherein the second NAND gate is arranged for receiving the output signal from the first NAND logic gate and the non-inverted output signal from the second dynamic flip flop in order to supply an output signal to the input of the second flip flop, the non-inverted output signal from the second flip flop being provided to the input of the first dynamic flip flop.

3. The prescaler circuit according to claim 2, wherein the first dynamic flip flop includes a first active branch, in which there are arranged, in series, between a positive terminal and a negative terminal connected to a continuous voltage source, first and second PMOS transistors, and a first NMOS transistor, one gate of the first PMOS and NMOS transistors being connected to form the input terminal of the flip flop, whereas one gate of the second PMOS transistor receives a clock signal for clocking the flip flop, a second active branch, in which there are arranged, in series, a third PMOS transistor and second and third NMOS transistors, one gate of the third PMOS and NMOS transistors receiving the clock signal, whereas one gate of the second NMOS transistor is connected to the drains of the second PMOS transistor and the first NMOS transistor, and a third active branch, in which there are arranged, in series, a fourth PMOS transistor and fourth and fifth NMOS transistors, one gate of the fourth NMOS transistor receiving the clock signal, whereas one gate of the fourth PMOS transistor is connected with one gate of the fifth NMOS transistor to the drains of the second NMOS transistor and the third PMOS transistor, the drain connection node of the fourth PMOS and NMOS transistors suppliying the inverted output signal.

4. The prescaler circuit according to claim 3, wherein the second dynamic flip flop includes three active branches like the first and third flip flops, and one inverter stage for supplying a non-inverted output signal.

5. The prescaler circuit according to claim 1, wherein the divided output signal of the prescaler circuit is supplied by an inverted output of the second flip flop.

6. The prescaler circuit according to claim 1, wherein it includes a third dynamic D-type flip flop with a single inverted output, which is formed of three active branches, the third flip flop receiving at input an inverted division mode selection signal in order to provide, via the inverted output, the mode selection signal to the first NAND logic gate, said third flip flop being clocked by the non-inverted output signal from the second flip flop.

7. The prescaler circuit according to claim 6, wherein the first and/or third dynamic flip flops include a first active branch, in which there are arranged, in series, between a positive terminal and a negative terminal connected to a continuous voltage source, first and second PMOS transistors, and a first NMOS transistor, one gate of the first PMOS and NMOS transistors being connected to form the input terminal of the flip flop, whereas one gate of the second PMOS transistor receives a clock signal for clocking the flip flop, a second active branch, in which there are arranged, in series, a third PMOS transistor and second and third NMOS transistors, one gate of the third PMOS and NMOS transistors receiving the clock signal, whereas one gate of the second NMOS transistor is connected to the drains of the second PMOS transistor and the first NMOS transistor, and a third active branch, in which there are arranged, in series, a fourth PMOS transistor and fourth and fifth NMOS transistors, one gate of the fourth NMOS transistor receiving the clock signal, whereas one gate of the fourth PMOS transistor is connected with one gate of the fifth NMOS transistor to the drains of the second NMOS transistor and the third PMOS transistor, the drain connection node of the fourth PMOS and NMOS transistors suppliying the inverted output signal.

8. The prescaler circuit according to claim 1, wherein it is integrated in a P-doped silicon substrate in 0.18 μm CMOS technology.

9. The prescaler circuit according to claim 1, wherein it includes, after the first divider-by-2 or divider-by-3 assembly, a series of dividers-by-2 combined with other divider-by-2 or divider-by-3 assemblies, which are each formed of at least two dynamic D-type flip flops, and two NAND gates arranged in negative feedback between the two flip flops.

* * * * *